US012666718B2

(12) United States Patent
Zhang et al.

(10) Patent No.: US 12,666,718 B2
(45) Date of Patent: Jun. 23, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Weiqi Zhang, Wuhan (CN); Wei Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 604 days.

(21) Appl. No.: 18/029,222

(22) PCT Filed: Mar. 22, 2023

(86) PCT No.: PCT/CN2023/083193
§ 371 (c)(1),
(2) Date: Mar. 29, 2023

(87) PCT Pub. No.: WO2024/011947
PCT Pub. Date: Jan. 18, 2024

(65) Prior Publication Data
US 2024/0021622 A1 Jan. 18, 2024

(30) Foreign Application Priority Data
Jul. 15, 2022 (CN) .......................... 202210836438.8

(51) Int. Cl.
*H10D 86/60* (2025.01)
*H10D 86/40* (2025.01)

(52) U.S. Cl.
CPC ........... *H10D 86/60* (2025.01); *H10D 86/423* (2025.01); *H10D 86/441* (2025.01)

(58) Field of Classification Search
CPC .... H10D 86/60; H10D 86/441; H10D 86/423; H10D 30/6723; H10D 86/481; H10D 86/451
(Continued)

(56) References Cited

U.S. PATENT DOCUMENTS 8,822,995 B2 * 9/2014 You .................... H10D 86/0231
257/295
12,408,436 B2 * 9/2025 An ........................ H10D 86/441
(Continued)

FOREIGN PATENT DOCUMENTS

CN 110880518 A 3/2020
CN 110890381 A 3/2020
(Continued)

OTHER PUBLICATIONS

PCT International Search Report for International Application No. PCT/CN2023/083193, mailed on Jun. 2, 2023, 7pp.
(Continued)

*Primary Examiner* — Monica D Harrison
(74) *Attorney, Agent, or Firm* — The Roy Gross Law Firm, LLC; Roy Gross

(57) ABSTRACT
A display panel and a display device are provided. The present disclosure reduces the magnitude of an electric field formed between a second active layer and a first gate, and improves the stability of a thin film transistor (TFT) formed by the second active layer, the first gate, a second source, and a second drain. Accordingly, the present disclosure solves a problem in conventional oxide TFTs by preventing a TFT device formed by a bottom gate from having poor reliability.

18 Claims, 8 Drawing Sheets

(58) Field of Classification Search
USPC ............................................................ 257/59
See application file for complete search history.

(56) References Cited

U.S. PATENT DOCUMENTS

| | | | | |
|---|---|---|---|---|
| 2021/0257392 A1* | 8/2021 | Huang | ............... | H10D 30/6731 |
| 2024/0072063 A1* | 2/2024 | Hong | ................ | H10D 86/0221 |

FOREIGN PATENT DOCUMENTS

| | | | |
|---|---|---|---|
| CN | 111276497 A | 6/2020 |
| CN | 111276546 A | 6/2020 |
| CN | 112071268 A | 12/2020 |
| CN | 112397029 A | 2/2021 |
| CN | 113345924 A | 9/2021 |
| CN | 113593478 A | 11/2021 |
| CN | 114512496 A | 5/2022 |
| CN | 114550653 A | 5/2022 |
| CN | 115207000 A | 10/2022 |

OTHER PUBLICATIONS

PCT Written Opinion of the International Searching Authority for International application No. PCT/CN2023/083193, mailed on Jun. 2, 2023, 9pp.

Chinese Office Action issued in corresponding Chinese Patent Application No. 202210836438.8 dated Apr. 23, 2025, pp. 1-8, 16pp.

Chinese Office Action issued in corresponding Chinese Patent Application No. 202210836438.8 dated Nov. 1, 2025, pp. 1-8, 18pp.

* cited by examiner

DISPLAY PANEL AND DISPLAY DEVICE

CROSS REFERENCE TO RELATED APPLICATIONS

This application is a National Phase of PCT Patent Application No. PCT/CN2023/083193 having International filing date of Mar. 22, 2023, which claims the benefit of priority of Chinese Patent Application No. 202210836438.8, filed Jul. 15, 2022, the contents of which are all incorporated herein by reference in their entirety.

FIELD OF DISCLOSURE

The present application relates to a field of display technology and in particular, to a display panel and a display device.

TECHNICAL BACKGROUND

Conventional organic light emitting diodes (OLED) usually use low temperature poly-silicon (LTPS) thin film transistors (TFT) or indium gallium zinc oxide thin film transistors (IGZO TFTs). Both have their own advantages and disadvantages. LTPS TFTs have the advantages of high electron mobility and high stability. The disadvantage of LTPS TFTs is that LTPS TFTs have high leakage current, so capacitors need to be charged from time to time to ensure normal display of a screen, and the lowest frequency is 30 HZ, which cannot realize low-frequency refresh and leads to high driving power consumption. IGZO TFTs have advantages of lower leakage current, lower driving power consumption, and lower costs. The disadvantages of IGZO TFT are lower electron mobility, being unstable and easy to oxidize in the air, and shorter lifespan of display panels.

Then, low temperature polycrystalline oxide (LTPO) TFTs with low leakage current and low power consumption are launched, which combines the advantages of LTPS TFTs and IGZO TFTs. LTPO TFTs can realize 1 HZ low-frequency display, and adjust the display frequency according to usage scenarios, thus effectively reducing the power consumption of the display panel.

SUMMARY OF INVENTION

Technical Problem

A conventional low temperature polycrystalline oxide thin film transistors (LTPO TFTs) have a first dielectric layer disposed between a bottom gate and an active pattern of the oxide TFT, and a second dielectric layer disposed between a top gate and the active pattern of the oxide TFT. Due to production limitations, the first dielectric layer has poor film quality, and it is difficult to adjust the film quality, leading to poor reliability of the first dielectric layer. As a result, it is difficult to adjust and control the interface quality between the active pattern and the first dielectric layer. During operation of a device, when a scan signal line is at high potential (NVGH), the channel of the oxide TFT forms an electric field with a top gate and also forms an electric field with a bottom gate. After long time operation, this leads to threshold voltage drifts of a bottom gate IGZO TFT, resulting in poor reliability of the bottom gate IGZO-TFT and eventually poor reliability of the whole oxide TFT.

Solution to Problem

It is an objective of the present disclosure to provide a display panel and a display device, which can solve the problem of low reliability of conventional LTPO TFTs.

Accordingly, the present disclosure provides a display panel, including a substrate; a first active layer disposed at one side of the substrate; a second active layer disposed at one side of the first active layer away from the substrate, a material of the second active layer including metal oxide; a first conductive layer disposed between the substrate and the second active layer, the first conductive layer including a first gate disposed corresponding to the second active layer; and a second conductive layer disposed at one side of the second active layer away from the substrate, the second conductive layer including a second gate disposed corresponding to the second active layer; wherein a first operating voltage connected to the first gate is lower than a second operating voltage connected to the second gate.

Moreover, a spacing between the first gate and the second active layer is larger than or equal to a spacing between the second gate and the second active layer.

Moreover, the display panel further includes a third conductive layer disposed between the first active layer and the first conductive layer, wherein the third conductive layer includes a third gate and a first capacitive electrode, the third gate and the first capacitive electrode are disposed corresponding to the first active layer, and the first conductive layer further includes a second capacitive electrode disposed corresponding to the first capacitive electrode.

Moreover, the display panel further includes a fourth conductive layer disposed between the first conductive layer and the second active layer, wherein the first conductive layer further includes a third gate and a first capacitive electrode, the third gate and the first capacitive electrode are disposed corresponding to the first active layer, and the fourth conductive layer includes a second capacitive electrode disposed corresponding to the first capacitive electrode.

Furthermore, the first gate and the first active layer are disposed in a same layer, and a material of the first gate is same as a semiconductor material of the first active layer.

Furthermore, the first conductive layer is disposed between the first active layer and the substrate, and the first conductive layer further includes a light shielding portion disposed corresponding to the first active layer.

Moreover, the first operating voltage connected to the first gate ranges from −7V to +1V.

Moreover, the first gate is suspended or electrically connected to one of a high voltage power line, a low voltage power line, a reset signal line, or a ground line.

Furthermore, the display panel further includes a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line, a data line, and a first light-emitting control signal line; wherein the reset signal line includes a first reset signal line and a second reset signal line; the first thin film transistor includes a source and a drain, the source of the first thin film transistor is electrically connected to the high voltage power line, and the drain of the first thin film transistor is electrically connected to the low voltage power line; the second thin film transistor includes a source, a drain, and a gate, the source of the second thin film transistor is electrically connected to the source of the first thin film transistor, the drain of the second thin film transistor is electrically connected to the data line, and the gate of the second thin film transistor is electrically connected to the first scan line; the third thin film transistor includes a source and a drain, the source of the third thin film transistor is electrically connected to the drain of the first thin film transistor, the drain of the third thin film transistor is electrically connected to a gate of the first thin film transistor, the third thin film transistor includes a first gate and a second gate, the first operating voltage connected to the first gate of the third thin film transistor is lower than the second operating voltage connected to the second gate, the first gate of the third thin film transistor is suspended or electrically connected to one of the high voltage power line, the low voltage power line, the first reset signal line, the second reset signal line, or the ground line, and the second gate of the third thin film transistor is electrically connected to the second scan line; the fourth thin film transistor includes a source and a drain, the source of the fourth thin film transistor is electrically connected to the gate of the first thin film transistor, the drain of the fourth thin film transistor is electrically connected to the first reset signal line, the fourth thin film transistor includes a first gate and a second gate, wherein the first operating voltage connected to the first gate of the fourth thin film transistor is lower than the second operating voltage connected to the second gate of the fourth thin film transistor, the first gate of the fourth thin film transistor is suspended or is electrically connected to one of the high voltage power line, the low voltage power line, the first reset signal line, the second reset signal line, or the ground line, the second gate of the fourth thin film transistor is electrically connected to the third scan line; the fifth thin film transistor includes a gate, a source, and a drain, the gate of the fifth thin film transistor is electrically connected to the first light-emitting control signal line, the source of the fifth thin film transistor is electrically connected to the source of the first thin film transistor, and the drain of the fifth thin film transistor is electrically connected to the high voltage power line; the sixth thin-film transistor includes a gate, a source, and a drain, the gate of the sixth thin-film transistor is electrically connected to the first light-emitting control signal line, the source of the sixth thin-film transistor is electrically connected to the drain of the first thin-film transistor, and the drain of the sixth thin-film transistor is electrically connected to the low voltage power line; and the seventh thin film transistor includes a source, a drain, and a gate, the source of the seventh thin film transistor is electrically connected to the drain of the sixth thin film transistor, the drain of the seventh thin film transistor is electrically connected to the second reset signal line, and the gate of the seventh thin film transistor is electrically connected to the fourth scan line.

Furthermore, the third thin film transistor and the fourth thin film transistor both include the second active layer, a material of the second active layer includes metal oxide; and the first thin film transistor includes the first active layer, a material of the first active layer includes low temperature polycrystalline silicon.

The advantages of the present application: A first conductive layer is disposed between a second active layer and a substrate. The first conductive layer includes a first gate disposed corresponding to the second active layer. The second active layer is disposed at one side of a second conductive layer away from the substrate. The second conductive layer includes a second gate disposed corresponding to the second active layer. A first operating voltage connected to the first gate is lower than a second operating voltage connected to the second gate. The first gate is suspended or is electrically connected to one of a high voltage power line, a low voltage power line, a reset signal line, and a ground line, thus reducing the magnitude of an electric field formed between the second active layer and the first gate, and enhancing the stability of a thin film transistor

4

(TFT) formed by the second active layer, the first gate, the second source, and the second drain. Accordingly, the present disclosure prevents the TFT formed by the bottom gate from having poor reliability like conventional oxide TFTs do.

Advantageous Effect

Compared with the conventional techniques, a spacing between the first gate and the second active layer of the present disclosure is larger than or equal to a spacing between the second gate and the second active layer, thus reducing the magnitude of an electric field formed between the second active layer and the first gate, improving the stability of a TFT formed by the second active layer, the first gate, the second source, and the second drain, thus preventing the TFT formed by the bottom gate from having poor reliability like conventional oxide thin film transistors do.

BRIEF DESCRIPTION OF DRAWINGS

In order to more clearly illustrate the embodiments of the present application, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

Figure 1:
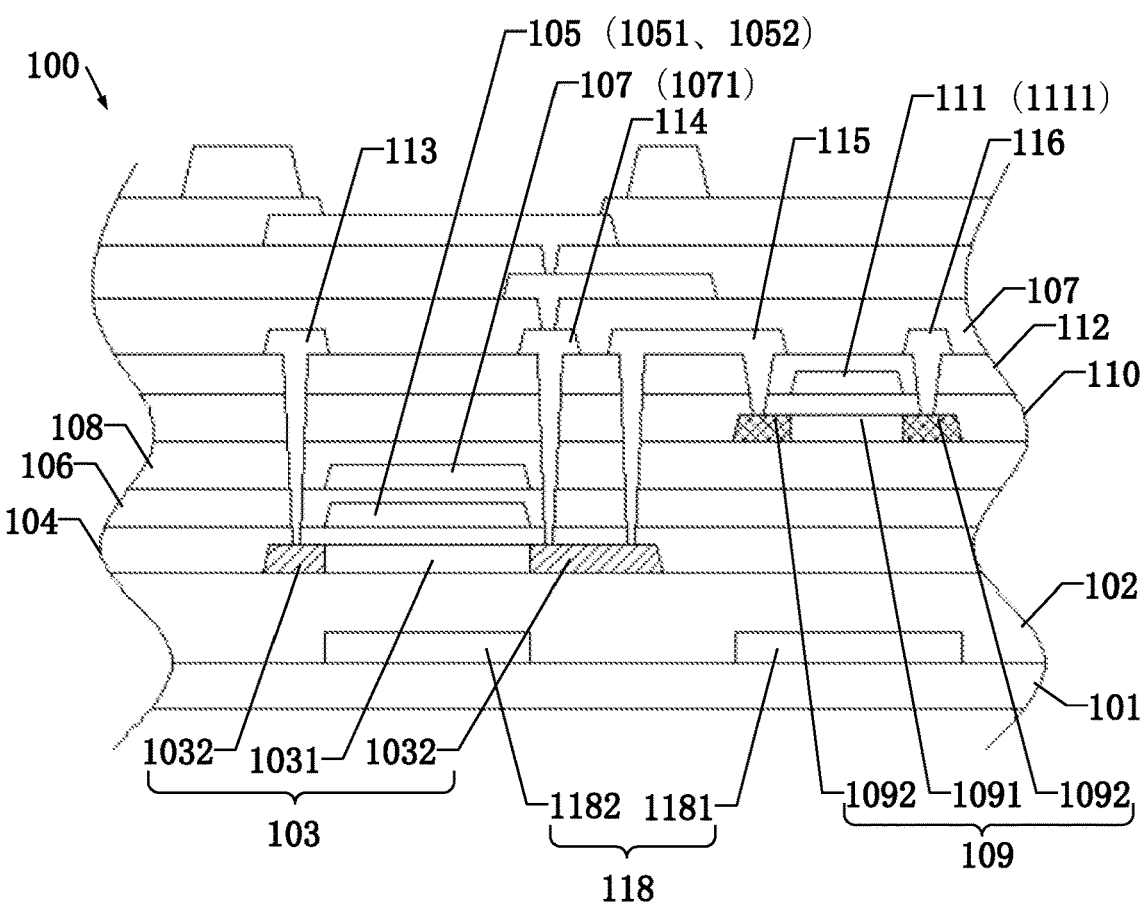
FIG. 1 is a schematic structural view of a display panel according to a first embodiment of the present disclosure.

The reference numerals in the accompanying drawings are as follows:

| | |
|---|---|
| 100: display panel; | |
| 101: substrate; | 102: buffer layer; |
| 103: first active layer; | 104: first insulating layer; |
| 105: third conductive layer; | 106: second insulating layer; |

-continued

| | |
|---|---|
| 107: fourth conductive layer; | 108: first interlayer insulating layer; |
| 109: second active layer; | 110: third insulating layer; |
| 111: second conductive layer; | 112: second interlayer insulating layer; |
| 113: first source; | 114: first drain; |
| 115: second source; | 116: second drain; |
| 117: first planarization layer; | 118: first conductive layer; |
| 1181: first gate; | 1182: light shielding portion; |
| 1111: second gate; | 1051: third gate; |
| 1052: first capacitive plate; | 1071: second capacitive plate. |

DETAILED DESCRIPTION OF EMBODIMENTS

Preferable embodiments of the present disclosure are illustrated below with reference to accompanying drawings, for explaining the examples in which the present disclosure can be realized. The embodiments are used to fully describe technical solutions of the present disclosure so that those skilled in the art may clearly and easily understand the technical solutions. However, the present disclosure may be realized in various embodiments, so the protection scope of the present disclosure is not limited to the embodiments mentioned in the specification.

It should be understood that directional terms, such as "upper", "lower", "front", "rear", "left", "right", "inside", "outside," "lateral", are used to describe the directions in the accompanying drawings. These directional terms are for illustrative purpose, and are not intended to limit the protection scope of the present disclosure.

In the accompanying drawings, structurally identical components are designated by same reference numerals, and structurally or functionally similar components are designated by similar numerical reference numerals throughout the specification. Besides, the dimensions and thicknesses of the components shown in the drawings are not to scale. The present disclosure is not limited to particular sizes and thicknesses of the components.

First Embodiment

The present embodiment provides a display device. The display device can be a smart phone, a computer, an MP3, an MP4, a tablet computer, a television, or a digital camera, etc. The display device includes a display panel 100.

As shown in FIG. 1, the present embodiment provides the display panel 100. The display panel 100 includes a substrate 101, a buffer layer 102, a first active layer 103, a first insulating layer 104, a third conductive layer 105, a second insulating layer 106, a fourth conductive layer 107, a first interlayer insulating layer 108, a second active layer 109, a third insulating layer 110, a second conductive layer 111, a second interlayer insulating layer 112, a first source 113, a first drain 114, a second source 115, a second drain 116, a first planarization layer 117, and a first conductive layer 118.

A material of the substrate 101 includes polyimide, polycarbonate, polyethylene terephthalate, and polyethylene naphthalene dicarboxylate. The substrate 101 thus has a better impact resistance to effectively protect the display panel 100.

The first conductive layer 118 is disposed between the substrate 101 and the second active layer 109. In the present embodiment, the first conductive layer 118 is disposed between the first active layer 103 and the substrate 101. The first conductive layer 118 includes a light shielding portion 1182 disposed corresponding to the first active layer 103. This way, the light shielding portion 1182 can shield electric fields resulting from non-coincidence of centers of positive and negative ions inside the substrate 101 and electric fields formed at interfaces between different layers, thus preventing electrical characteristics of the first active layer 103 from being affected by the electric fields, so that the present disclosure can prevent residual images and defects caused by ESD on display screens.

The first conductive layer 118 further includes a first gate 1181 disposed corresponding to the second active layer 109. A material of the first gate 1181 is a conductive metal. For example, titanium, molybdenum, aluminum, copper, or nickel.

The buffer layer 102 covers one side of the first conductive layer 118 away from the substrate 101. The buffer layer 102 is mainly used for buffering and can be made of SiOx or SiNx or SiNOx, or can be a combined structure of SiNx and SiOx.

The first active layer 103 is disposed at one side of the substrate 101. The first active layer 103 includes a first channel portion 1031 and two first conductive portions 1032 disposed at two ends of the first channel portion 1031.

The first insulating layer 104 is disposed on one side of the first active layer 103 away from the substrate 101 and extends to cover the buffer layer 102. The first insulating layer 104 is mainly used to prevent a short circuit due to direct contact between the first active layer 103 and the third conductive layer 105. A material of the first insulating layer 104 can be made of SiOx, SiNx, or $Al_2O_3$, or can be combined structure of SiNx and SiOx, or a combined structure of SiOx, SiNx and SiOx.

The third conductive layer 105 is disposed on one side of the first insulating layer 104 away from the substrate 101. The third conductive layer 105 is disposed between the first active layer 103 and the second active layer 109. The third conductive layer 105 includes a third gate 1051 and a first capacitive plate 1052 disposed corresponding to the first active layer 103. The third gate 1051 is disposed on one side of the first insulating layer 104 away from the substrate 101 and is disposed corresponding to the first channel portion 1031 of the first active layer 103. The third gate 1051 can be made of Mo, or can be a combined structure of Mo and Al, or a combined structure of Mo and Cu, a combined structure of Mo, Cu and IZO, a combined structure of IZO, Cu and IZO, a combined structure of Mo, Cu and ITO, a combined structure of Ni, Cu and Ni, a combined structure of MoTiNi, Cu and MoTiNi, or a combined structure of NiCr, Cu and NiCr, or can be made of CuNb.

The second insulating layer 106 is disposed on one side of the third conductive layer 105 away from the substrate 101 and extends to cover the first insulating layer 104. The second insulating layer 106 is mainly used to prevent a short circuit due to direct contact between the third conductive layer 105 and the fourth conductive layer 107. The second insulating layer 106 can be made of SiOx, SiNx, or $Al_2O_3$, or can be a combined structure of SiNx and SiOx or a combined structure of SiOx, SiNx, and SiOx.

A fourth conductive layer 107 is disposed on one side of the second insulating layer 106 away from the substrate 101. The fourth conductive layer 107 is disposed between the third conductive layer 105 and the second active layer 109. The fourth conductive layer 107 further includes a second capacitive plate 1071 disposed corresponding to the first capacitive plate 1052. The second capacitive plate 1071 is disposed at one side of the second insulating layer 106 away from the substrate 101 and is disposed corresponding to the first capacitive plate 1052. The second capacitive plate 1071 causes a coupling effect with the first capacitive plate 1052 to form a storage capacitance Cst. The second capacitive plate 1071 can be made of Mo, or can be a combined structure of Mo and Al, a combined structure of Mo and Cu or a combined structure of Mo, Cu and IZO, a combined structure of IZO, Cu and IZO, a combined structure of Mo, Cu and ITO, a combined structure of Ni, Cu and Ni, a combined structure of MoTiNi, Cu and MoTiNi, or a combined structure of NiCr, Cu and NiCr, or can be made of CuNb.

The first interlayer insulating layer 108 is disposed at one side of the fourth conductive layer 107 away from the substrate 101 and extends to cover the second insulating layer 106. A material of the first interlayer insulating layer 108 can be SiOx or SiNx or SiNOx, etc.

The second active layer 109 is disposed at one side of the first interlayer insulating layer 108 away from the substrate 101, and a material of the second active layer 109 includes metal oxide. In the present embodiment, a material of the second active layer 109 is IGZO. The second active layer 109 includes a second channel portion 1091 and a second conductive portion 1092 disposed at two ends of the second channel portion 1091.

The third insulating layer 110 is disposed on one side of the second active layer 109 away from the substrate 101 and extends to cover the first interlayer insulating layer 108. The third insulating layer 110 is mainly used to prevent a short circuit due to direct contact between the second active layer 109 and the second conductive layer 111. The third insulating layer 110 can be made of SiOx or SiNx or $Al_2O_3$, or can be a combined structure of SiNx and SiOx or a combined structure of SiOx, SiNx and SiOx.

The second conductive layer 111 is disposed at one side of the second active layer 109 away from the substrate 101. The second conductive layer 111 includes a second gate 1111 disposed corresponding to the second active layer 109. The second gate 1111 is disposed at one side of the third insulating layer 110 away from the substrate 101 and is disposed corresponding to the second channel portion 1091 of the second active layer 109. The second gate 1111 can be made of Mo, or can be a combined structure of Mo and Al, a combined structure of Mo and Cu, a combined structure of Mo, Cu and IZO, a combined structure of IZO, Cu and IZO, a combined structure of Mo, Cu and ITO, a combined structure of Ni, Cu and Ni, a combined structure of MoTiNi, Cu and MoTiNi, or a combined structure of NiCr, Cu and NiCr, or can be made of CuNb, etc.

A first operating voltage connected to the first gate 1181 is lower than a second operating voltage connected to the second gate 1111. The first operating voltage connected to the first gate 1181 ranges from −7V to +1V. The first gate 1181 is suspended or is electrically connected to one of a high voltage power line, a low voltage power line, a reset signal line, and a ground line, so as to reduce the magnitude of an electric field formed between the second active layer 109 and the first gate 1181, enhance the stability of the thin film transistor (TFT) formed by the second active layer 109, the first gate 1181, the second source 115, and the second drain 116, thereby preventing a problem of conventional oxide thin film transistors in which a TFT device formed by a bottom gate has poor reliability.

A spacing between the first gate 1181 and the second active layer 109 is larger than or equal to a spacing between the second gate 1111 and the second active layer 109, so as to reduce the magnitude of the electric field formed between the second active layer 109 and the first gate 1181, to enhance the stability of the TFT formed by the second active layer 109, the first gate 1181, the second source 115, and the second drain 116, thereby preventing the problem of conventional oxide thin film transistors in which a TFT device formed by a bottom gate has poor reliability.

The second interlayer insulating layer 112 is disposed on one side of the second conductive layer 111 away from the substrate 101 and extends to cover the third insulating layer 110. The second interlayer insulating layer 112 is mainly used to prevent a short circuit due to direct contact between the second conductive layer 111, the second source 115, and the second drain 116. A material of the second interlayer insulating layer 112 can be SiOx, SiNx, or SiNOx, etc.

The first source 113 and the first drain 114 are disposed in a same layer on one side of the second interlayer insulating layer 112 away from the substrate 101 and are electrically connected to the two first conductive portions 1032 of the first active layer 103, respectively.

In the present embodiment, the second source 115 and the second drain 116 are disposed in the same layer on one side of the second interlayer insulating layer 112 away from the substrate 101 and are electrically connected to the two second conductive portions 1092 of the second active layer 109, respectively. In the present embodiment, the first source 113, the first drain 114, the second source 115, and the second drain 116 are disposed in the same layer.

The first planarization layer 117 covers one side of each of the first source 113, the first drain 114, the second source 115, and the second drain 116 away from the substrate 101, and extends to cover the second interlayer insulation layer 112. The first planarization layer 117 can be made of SiOx, SiNx, or SiNOx, or can be a combined structure of SiNx and SiOx, etc.

Figure 2:
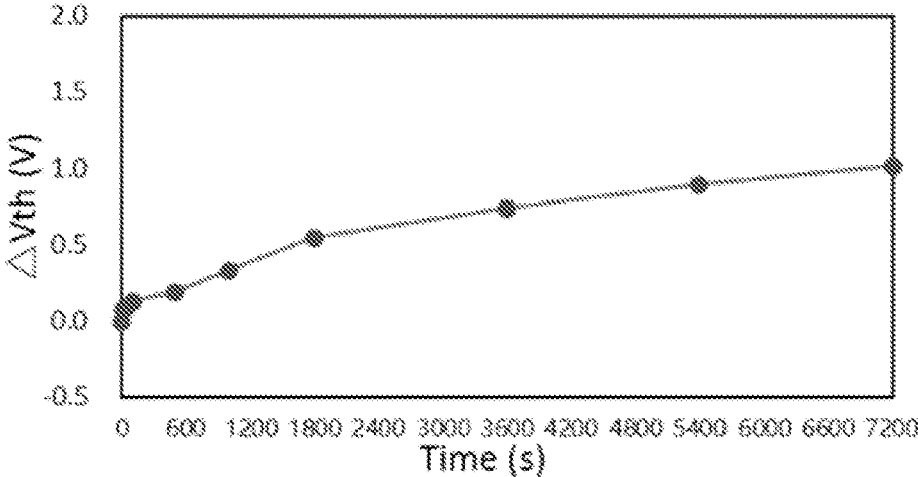
FIG. 2 is a schematic view illustrating that a threshold voltage changes with time when a voltage of 30V is applied to both a top gate and a bottom gate in a conventional dual-gate thin film transistor.
Figure 3:
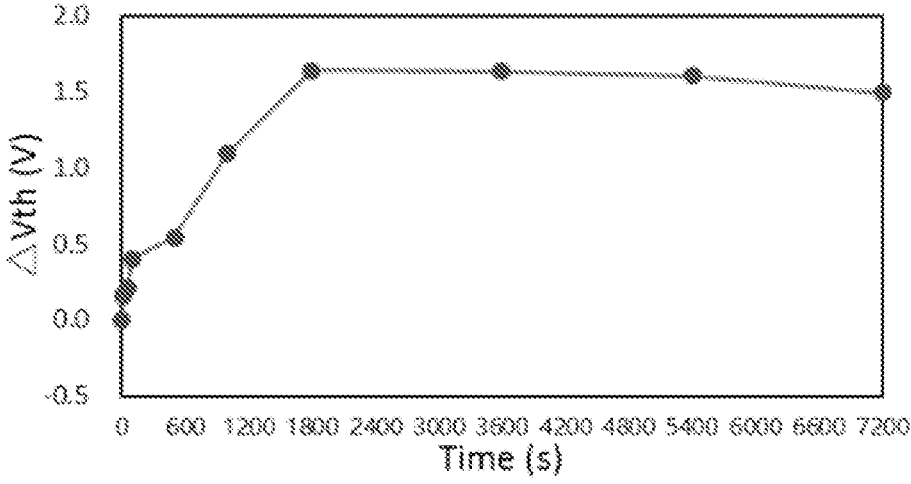
FIG. 3 is a schematic view illustrating that the threshold voltage changes with time when a voltage of 0V is applied to the top gate, and a voltage of 30V is applied to the bottom gate in the conventional dual-gate thin film transistor.
Figure 4:
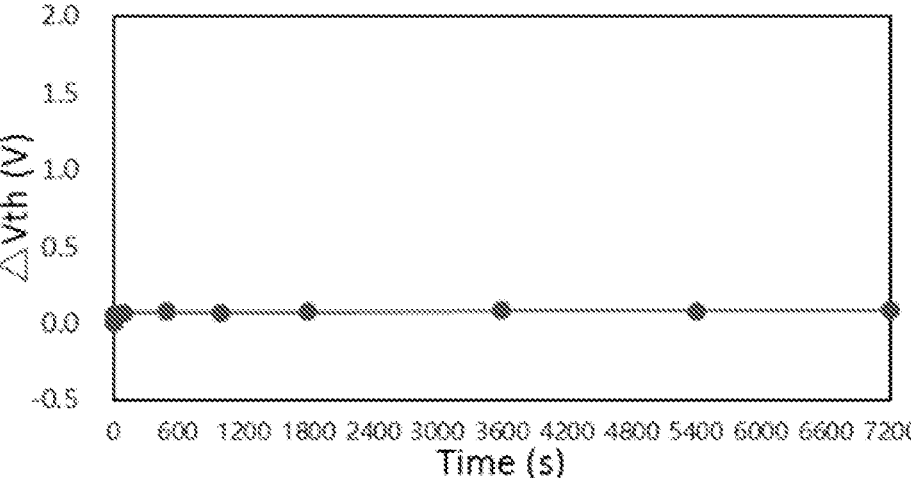
FIG. 4 is a schematic view of the first embodiment, illustrating the threshold voltage changes with time when a voltage of 30V is applied to the top gate and a voltage of 0V is applied to the bottom gate in the conventional dual-gate thin film transistor.

Please refer to FIGS. 2, 3, and 4. Compared to the conventional techniques, a difference ΔVth of threshold voltages (Vth) before or after using the second active layer 109 is close to 0. This means that the second active layer 109 in the embodiment has the best PBTS (quantitative indicator for reliability).

Figure 5:
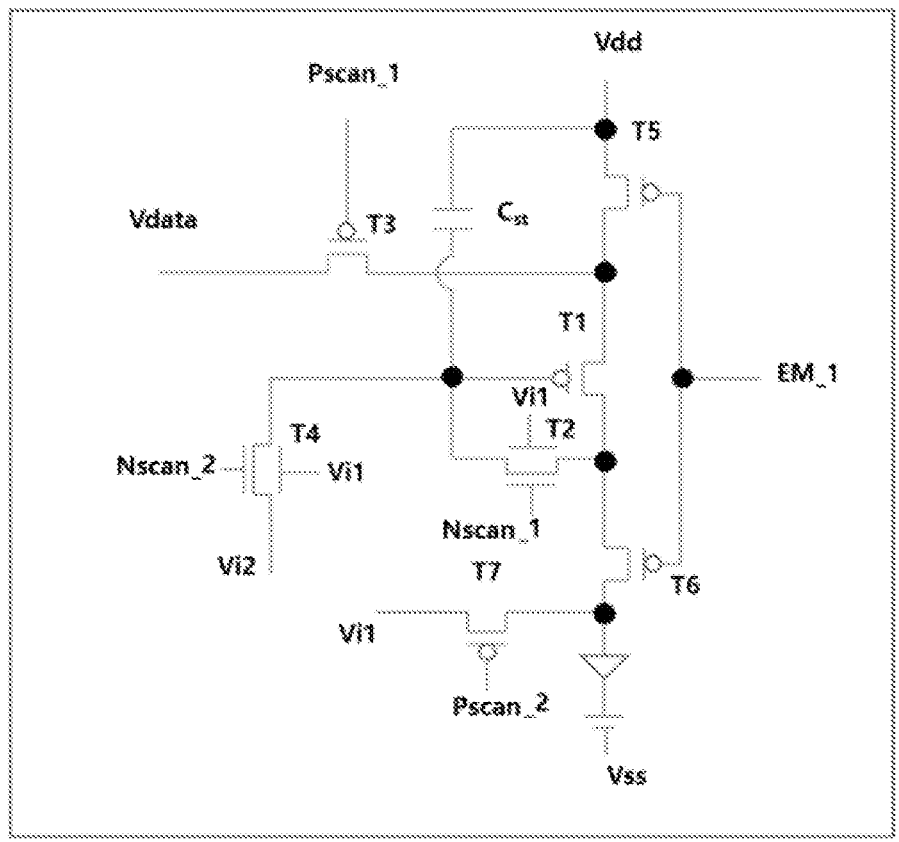
FIG. 5 is a circuit diagram of the display panel according to the first embodiment of the present disclosure.

As shown in FIG. 5, the display panel 100 of the present embodiment includes a first thin film transistor T1, a second thin film transistor T2, a third thin film transistor T3, a fourth thin film transistor T4, a fifth thin film transistor T5, a sixth thin film transistor T6, a seventh thin film transistor T7, a storage capacitor Cst, a first reset signal line Vi1, a second reset signal line Vi2, a first scan line Pscan-1, a second scan line Nscan-1, a third scan line Nscan-1, a fourth scan line Pscan-2, a data line Vdata, a low-voltage power line Vss, a high-voltage power line Vdd, and a first light-emitting control signal line EM-1.

The source of the first thin film transistor T1 is electrically connected to the high voltage power line Vdd, and the drain of the first thin film transistor T1 is electrically connected to the low voltage power line Vss. The first thin film transistor T1 includes the first active layer 103, and a material of the first active layer 103 includes low temperature polycrystalline silicon. In the embodiment, the first thin film transistor T1 includes the first active layer 103, and a material of the first active layer 103 is low temperature polycrystalline silicon (LTPS).

A source of the second thin film transistor T2 is electrically connected to the source of the first thin film transistor T1, a drain of the second thin film transistor T1 is electrically connected to the data line Vdata, and a gate of the second thin film transistor T1 is electrically connected to the first scan line Pscan-1.

A source of the third thin film transistor T3 is electrically connected to the drain of the first thin film transistor T1 and a drain of the third thin film transistor T3 is electrically connected to a gate of the first thin film transistor T1. The third thin film transistor T3 includes a first gate 1181 and a second gate 1111. A first operating voltage connected to the first gate 1181 of the third thin film transistor T3 is lower than a second operating voltage connected to the second gate 1111 of the third thin film transistor T3. The first gate 1181 of the third thin film transistor T3 is suspended or is electrically connected to one of the high voltage power line, the low voltage power line, the first reset signal line, the second reset signal line, or the ground line. The second gate 1111 of the third thin film transistor T3 is electrically connected to the second scan line Nscan-1. The third thin film transistor T3 includes the second active layer 109, and a material of the second active layer 109 includes metal oxide. In the present embodiment, the third thin film transistor T3 includes the second active layer 109, and a material of the second active layer 109 is metal oxide.

A source of the fourth thin film transistor T4 is electrically connected to the gate of the first thin film transistor T1, and a drain of the fourth thin film transistor T4 is electrically connected to the first reset signal line Vi1. The fourth thin film transistor T4 includes the first gate 1181 and the second gate 1111. The first operating voltage connected to the first gate 1181 of the fourth thin film transistor T4 is lower than the second operating voltage connected to the second gate 1111 of the fourth thin film transistor T4. The first gate 1181 of the fourth thin film transistor T4 is suspended or is electrically connected to one of the high voltage power line, the low voltage power line, the first reset signal line, the second reset signal line, or ground line. The second gate 1111 of the fourth thin film transistor T4 is electrically connected to a third scan line Nscan-2. A material of a semiconductor layer of the fourth thin film transistor T4 is metal oxide. The fourth thin film transistor T4 includes the second active layer 109, and a material of the second active layer 109 includes metal oxide. In the present embodiment, the fourth thin film transistor T4 includes the second active layer 109, and a material of the second active layer 109 is metal oxide.

A gate of the fifth thin film transistor T5 is electrically connected to the first light-emitting control signal line EM-1, a source of the fifth thin film transistor T5 is electrically connected to the source of the first thin film transistor T1, and a drain of the fifth thin film transistor T5 is electrically connected to the high voltage power line Vdd.

A gate of the sixth thin film transistor T6 is electrically connected to the first light-emitting control signal line EM-1, a source of the sixth thin film transistor T6 is electrically connected to the drain of the first thin film transistor T1, and a drain of the sixth thin film transistor T6 is electrically connected to the low voltage power line Vss.

A source of the seventh thin film transistor T7 is electrically connected to the drain of the sixth thin film transistor T6, a drain of the seventh thin film transistor T7 is electrically connected to the second reset signal line Vi2, and a gate of the seventh thin film transistor T7 is electrically connected to the fourth scan line Pscan-2.

A first end of the storage capacitor Cst is electrically connected to the gate of the first thin film transistor T1, and a second end thereof is electrically connected to the drain of the fifth thin film transistor T5.

The first operating voltage connected to the first gate 1181 of the third thin film transistor T3 is lower than the second operating voltage connected to the second gate 1111 of the third thin film transistor T3. A spacing between the first gate 1181 and the second active layer 109 is larger than or equal to a spacing between the second gate 1111 and the second active layer 109, so as to reduce the electric field formed between the second active layer 109 and the first gate 1181, to enhance the stability of the thin film transistor formed by the second active layer 109, the first gate 1181, the second source 115, and the second drain 116, thereby avoiding the problem of conventional oxide thin film transistors in which a TFT device formed by a bottom gate having poor reliability.

The first operating voltage connected to the first gate 1181 of the fourth thin film transistor T4 is lower than the second operating voltage connected to the second gate 1111, and the spacing between the first gate 1181 and the second active layer 109 is larger than or equal to the spacing between the second gate 1111 and the second active layer 109, so as to reduce the magnitude of the electric field formed between the second active layer 109 and the first gate 1181, to enhance the stability of the thin film transistor formed by the second active layer 109, the first gate 1181, the second source 115, and the second drain 116. Accordingly, the present disclosure prevents the problems of conventional oxide thin film transistors in which a TFT device formed by a bottom gate has poor reliability.

The first thin film transistor T1 includes a light shielding portion 1182. The first thin film transistor T1 uses the light shielding portion 1182 to shield the electric fields caused by non-coincidence of centers of positive and negative ions inside the substrate 101 and electric fields formed at interfaces between different layers, thus preventing electrical characteristics of the first active layer 103 from being affected by the electric fields, so that the present disclosure can prevent residual images and defects caused by ESD on display screens.

In summary, a pixel circuit of the display panel 100 of the present embodiment is a 7T1C circuit. In other embodiments, the pixel circuit of the display panel 100 may also be a 6T1C pixel circuit, a 6T2C pixel circuit, a 7T2C pixel circuit, an 8T1C pixel circuit, or an 8T2C pixel circuit.

Second Embodiment

Figure 6:
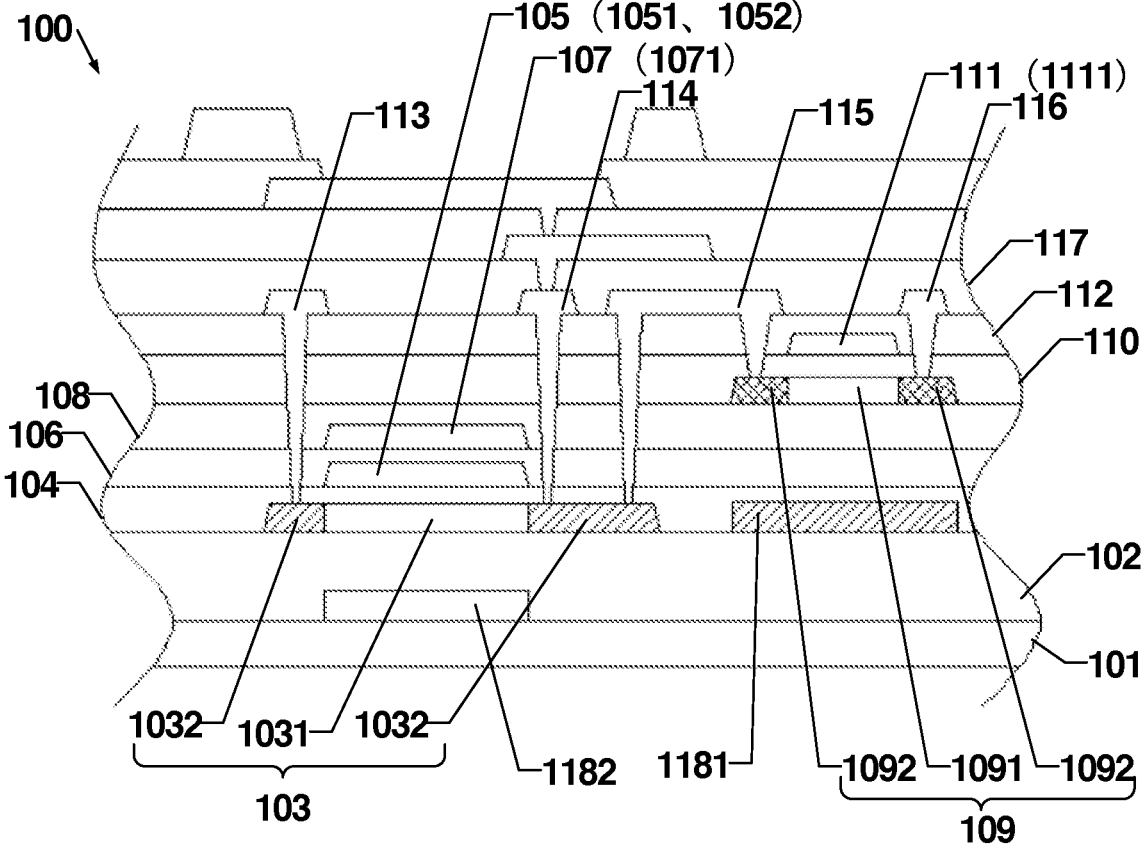
FIG. 6 is a schematic structural view of the display panel according to a second embodiment of the present disclosure.

As shown in FIG. 6, the present embodiment includes most of the technical features of the first embodiment. The second embodiment is different from the first embodiment 1 in that the first gate 1181 and the first active layer 103 are disposed in a same layer in the second embodiment. A material of the first gate 1181 is same as a semiconductor material of the first active layer 103. That is to say, the first gate 1181 is made of a material same as a material of the first conductive portions 1032 of the first active layer 103. Therefore, a same photomask can be used to form the first active layer 103 and the first gate 1181.

Third Embodiment

Figure 7:
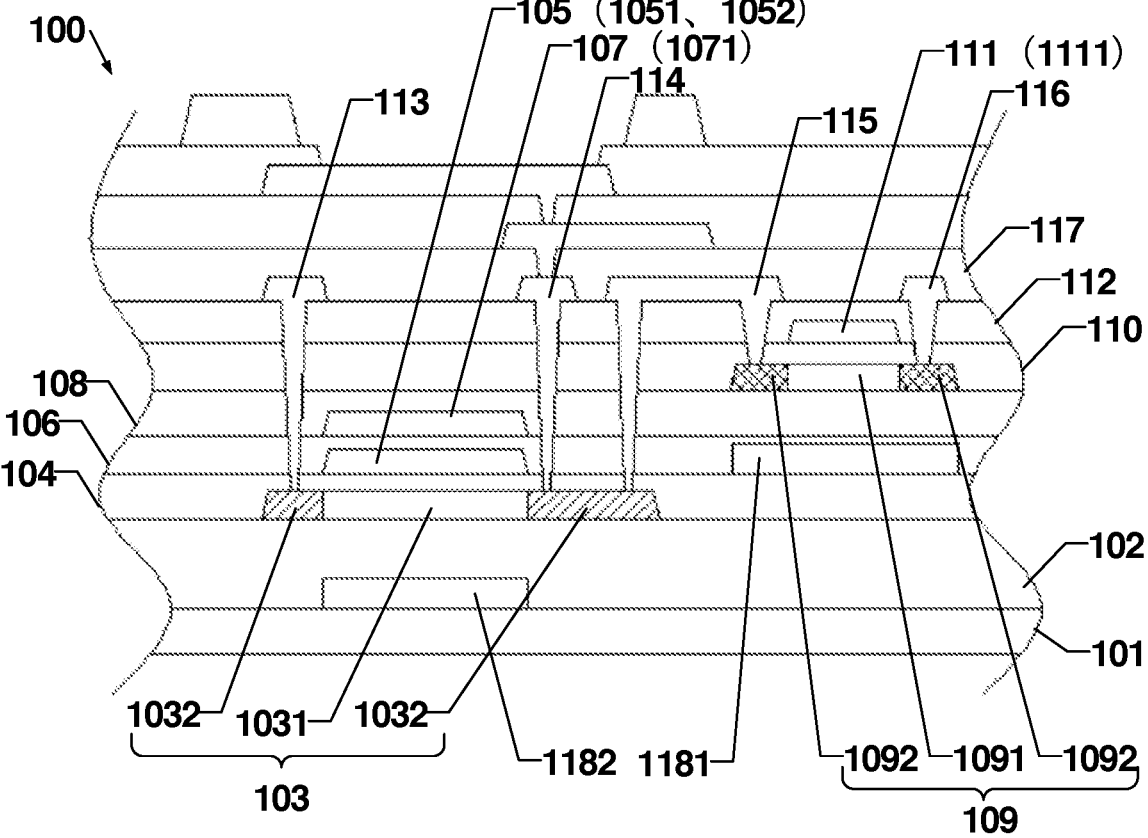
FIG. 7 is a schematic structural view of the display panel according to a third embodiment of the present disclosure.

As shown in FIG. 7, the present embodiment includes most of the technical features of the first embodiment. The third embodiment is different from the first embodiment in that the fourth conductive layer 107 in the present embodiment is disposed between the first conductive layer 118 and the second active layer 109. The first conductive layer 118 further includes the third gate 1051 and the first capacitive plate 1052 disposed corresponding to the first active layer 103. The fourth conductive layer 107 includes a second capacitive plate 1071 disposed corresponding to the first capacitive plate 1052. In other words, the first gate 1181 is disposed in a same layer as the third gate 1051 and the first capacitive plate 1052. The first gate 1181, the third gate 1051, and the first capacitive plate 1052 are made of the same material, so that a same photomask can be used to form the first gate 1181, the third gate 1051, and the first capacitive plate 1052.

Fourth Embodiment

Figure 8:
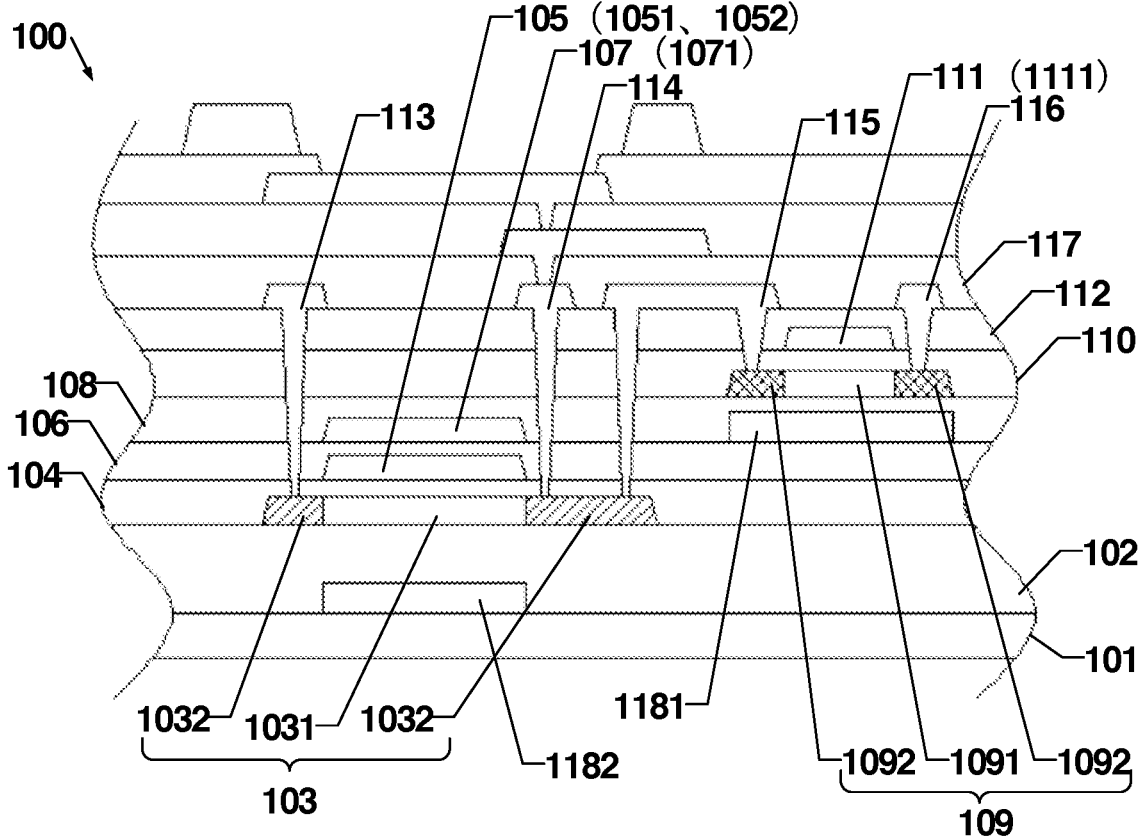
FIG. 8 is a schematic structural view of a first thin film transistor and a second thin film transistor of the display panel according to a fourth embodiment of the present disclosure.

As shown in FIG. 8, the fourth embodiment includes most of the technical features of the first embodiment. The fourth embodiment is different from the first embodiment in that the third conductive layer 105 in the fourth embodiment is disposed between the first active layer 103 and the first conductive layer 118. The third conductive layer 105 includes the third gate 1051 and the first capacitive plate 1052 disposed corresponding to the first active layer 103. The first conductive layer 118 further includes the second capacitive plate 1071 disposed corresponding to the first capacitive plate 1052. In other words, the first gate 1181 and the second capacitive plate 1071 are disposed in a same layer, and the first gate 1181 and the second capacitive plate 1071 are made of the same material, so that a same photomask can be used to form the first gate 1181 and the second capacitive plate 1071.

Fifth Embodiment

Figure 9:
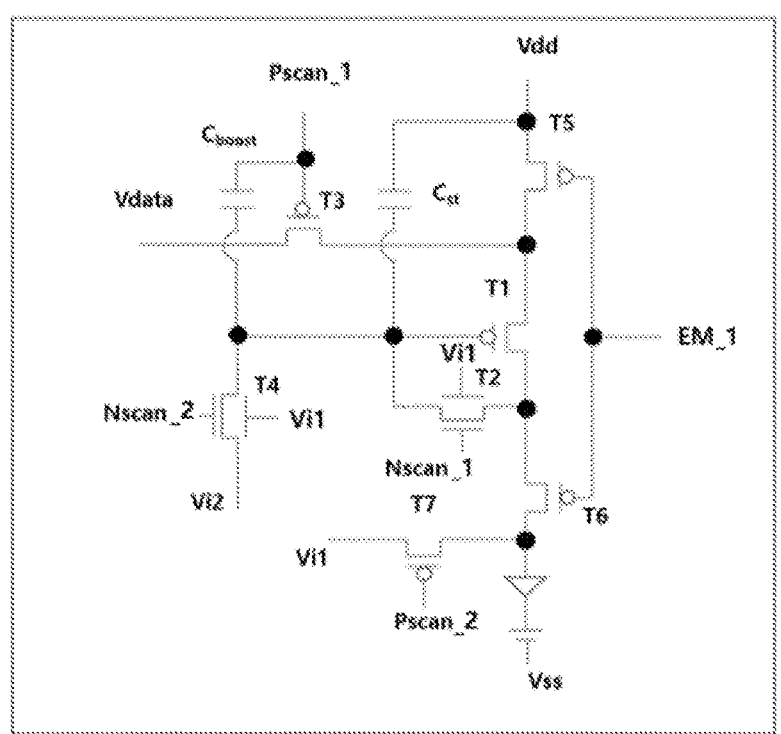
FIG. 9 is a circuit diagram of the display panel according to a fifth embodiment of the present disclosure.

As shown in FIG. 9, the fifth embodiment includes most of the technical features of the first embodiment, the second embodiment, the third embodiment, and the fourth embodiment. The fifth embodiment is different from the first embodiment, the second embodiment, the third embodiment, and the fourth embodiment in that the display panel 100 in the fifth embodiment further includes a second capacitor Cboost.

A first end of the second capacitor Cboost is electrically connected to the gate of the first thin film transistor T1 and a second end of the second capacitor Cboost is electrically connected to the gate of the second thin film transistor T2.

Sixth Embodiment

Figure 10:
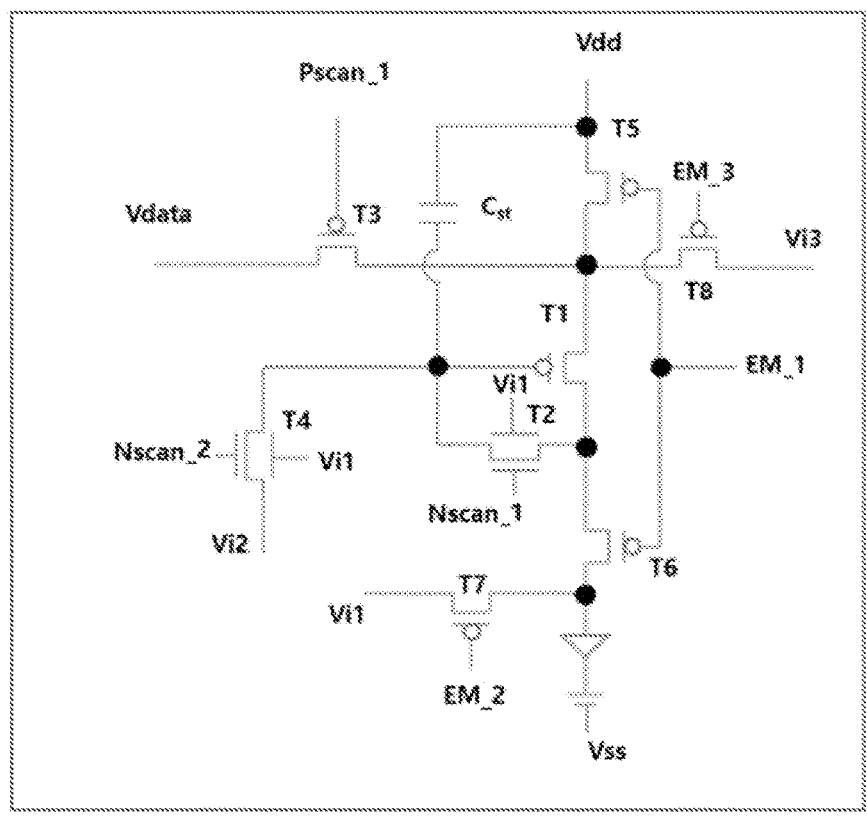
FIG. 10 is a circuit diagram of the display panel according to a sixth embodiment of the present disclosure.

As shown in FIG. 10, the sixth embodiment includes most of the technical features of the first embodiment, the second embodiment, the third embodiment, and the fourth embodiment. The sixth embodiment is different from the first embodiment, the second embodiment, the third embodiment, and the fourth embodiment in that the display panel 100 in the sixth embodiment further includes an eighth thin film transistor T8, a second light-emitting control signal line EM-2, a third light-emitting control signal line EM-3, and a third reset signal line Vi3.

A gate of the seventh thin film transistor T7 is electrically connected to the second light-emitting control signal line EM-2.

A gate of the eighth thin film transistor T8 is electrically connected to the third light-emitting control signal line EM-3, a source of the eighth thin film transistor T8 is electrically connected to the source of the first thin film transistor T1, and a drain of the eighth thin film transistor T8 is electrically connected to the third reset signal line Vi3.

Seventh Embodiment

Figure 11:
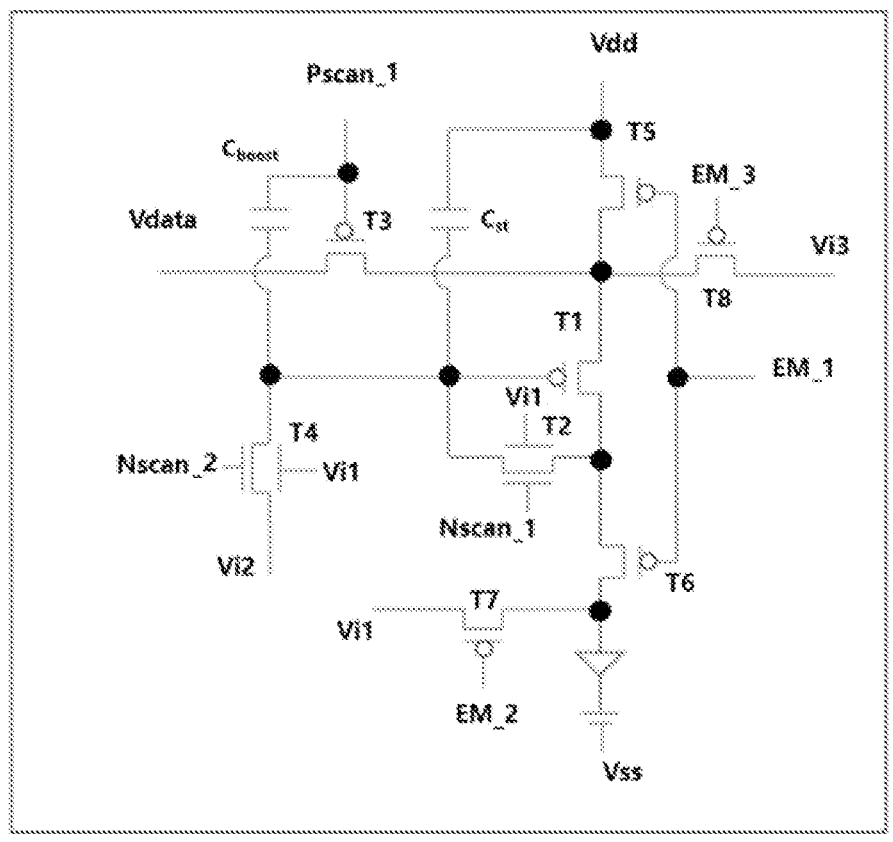
FIG. 11 is a circuit diagram of the display panel according to a seventh embodiment of the present disclosure.

As shown in FIG. 11, the seventh embodiment includes most of the technical features of the sixth embodiment. The seventh embodiment is different from the sixth embodiment in that the display panel 100 in the seventh embodiment further includes a second capacitor Cboost.

A first end of the second capacitor Cboost is electrically connected to the gate of the first thin film transistor T1, and a second of the second capacitor Cboost is electrically connected to the gate of the second thin film transistor T2.

The display panel and the display device provided in the present application are detailed as above, and specific examples are used to illustrate the principles and embodiments of the present application. The above description is only used for ease of understanding the method and main ideas of the present application. One of ordinary skill in the art can modify the embodiments and application range according to the ideas of the present application. In summary, the content of this specification should not be construed as a limitation to the present application.

What is claimed is:

1. A display panel, comprising:
a substrate;
a first active layer disposed at one side of the substrate;
a second active layer disposed at one side of the first active layer away from the substrate, a material of the second active layer including metal oxide;
a first conductive layer disposed between the substrate and the second active layer, the first conductive layer comprising a first gate disposed corresponding to the second active layer;
a second conductive layer disposed at one side of the second active layer away from the substrate, the second conductive layer comprising a second gate disposed corresponding to the second active layer; and
a third conductive layer disposed between the first active layer and the first conductive layer, wherein the third conductive layer comprises a third gate and a first capacitive electrode, the third gate and the first capacitive electrode are disposed corresponding to the first active layer, and the first conductive layer further comprises a second capacitive electrode disposed corresponding to the first capacitive electrode,
wherein a first operating voltage connected to the first gate is lower than a second operating voltage connected to the second gate, a spacing between the first gate and the second active layer is larger than or equal to a spacing between the second gate and the second active layer.

2. The display panel according to claim 1, wherein the first gate and the first active layer are disposed in a same layer, and a material of the first gate is same as a semiconductor material of the first active layer.

3. The display panel according to claim 1, wherein the first conductive layer is disposed between the first active layer and the substrate, and the first conductive layer further comprises a light shielding portion disposed corresponding to the first active layer.

4. The display panel according to claim 1, wherein the first operating voltage connected to the first gate ranges from −7V to +1V.

5. The display panel according to claim 1, wherein the first gate is suspended or electrically connected to one of a high voltage power line, a low voltage power line, a reset signal line, or a ground line.

6. The display panel according to claim 1, further comprising a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line, a data line, and a first light-emitting control signal line;

wherein the reset signal line comprises a first reset signal line and a second reset signal line;

the first thin film transistor comprises a source and a drain, the source of the first thin film transistor is electrically connected to the high voltage power line, and the drain of the first thin film transistor is electrically connected to the low voltage power line;

the second thin film transistor comprises a source, a drain, and a gate, the source of the second thin film transistor is electrically connected to the source of the first thin film transistor, the drain of the second thin film transistor is electrically connected to the data line, and the gate of the second thin film transistor is electrically connected to the first scan line;

the third thin film transistor comprises a source and a drain, the source of the third thin film transistor is electrically connected to the drain of the first thin film transistor, the drain of the third thin film transistor is electrically connected to a gate of the first thin film transistor, the third thin film transistor comprises a first gate and a second gate, the first operating voltage connected to the first gate of the third thin film transistor is lower than the second operating voltage connected to the second gate, the first gate of the third thin film transistor is suspended or electrically connected to one of the high voltage power line, the low voltage power line, the first reset signal line, the second reset signal line, or the ground line, and the second gate of the third thin film transistor is electrically connected to the second scan line;

the fourth thin film transistor comprises a source and a drain, the source of the fourth thin film transistor is electrically connected to the gate of the first thin film transistor, the drain of the fourth thin film transistor is electrically connected to the first reset signal line, the fourth thin film transistor comprises a first gate and a second gate, wherein the first operating voltage connected to the first gate of the fourth thin film transistor is lower than the second operating voltage connected to the second gate of the fourth thin film transistor, the first gate of the fourth thin film transistor is suspended or is electrically connected to one of the high voltage power line, the low voltage power line, the first reset signal line, the second reset signal line, or the ground line, the second gate of the fourth thin film transistor is electrically connected to the third scan line;

the fifth thin film transistor comprises a gate, a source, and a drain, the gate of the fifth thin film transistor is electrically connected to the first light-emitting control signal line, the source of the fifth thin film transistor is electrically connected to the source of the first thin film transistor, and the drain of the fifth thin film transistor is electrically connected to the high voltage power line;

the sixth thin-film transistor comprises a gate, a source, and a drain, the gate of the sixth thin-film transistor is electrically connected to the first light-emitting control signal line, the source of the sixth thin-film transistor is electrically connected to the drain of the first thin-film transistor, and the drain of the sixth thin-film transistor is electrically connected to the low voltage power line; and the seventh thin film transistor comprises a source, a drain, and a gate, the source of the seventh thin film transistor is electrically connected to the drain of the sixth thin film transistor, the drain of the seventh thin film transistor is electrically connected to the second reset signal line, and the gate of the seventh thin film transistor is electrically connected to the fourth scan line.

7. The display panel according to claim 6, wherein the third thin film transistor and the fourth thin film transistor both comprise the second active layer, a material of the second active layer comprises metal oxide; and the first thin film transistor comprises the first active layer, a material of the first active layer comprises low temperature polycrystalline silicon.

8. A display device comprising a display panel, the display panel comprising:

a substrate;

a first active layer disposed at one side of the substrate;

a second active layer disposed at one side of the first active layer away from the substrate, a material of the second active layer comprising metal oxide;

a first conductive layer disposed between the substrate and the second active layer, the first conductive layer comprising a first gate disposed corresponding to the second active layer;

a second conductive layer disposed at one side of the second active layer away from the substrate, the second conductive layer comprising a second gate disposed corresponding to the second active layer; and a third conductive layer disposed between the first active layer and the first conductive layer, wherein the third conductive layer comprises a third gate and a first capacitive electrode, the third gate and the first capacitive electrode are disposed corresponding to the first active layer, and the first conductive layer further comprises a second capacitive electrode disposed corresponding to the first capacitive electrode, wherein a first operating voltage connected to the first gate is lower than a second operating voltage connected to the second gate, a spacing between the first gate and the second active layer is larger than or equal to a spacing between the second gate and the second active layer.

9. The display device according to claim 8, wherein the first gate and the first active layer are disposed in a same layer, and a material of the first gate is same as a semiconductor material of the first active layer.

10. The display device according to claim 8, wherein the first conductive layer is disposed between the first active layer and the substrate, and the first conductive layer further comprises a light shielding portion disposed corresponding to the first active layer.

11. The display device according to claim 8, wherein the first operating voltage connected to the first gate ranges from −7V to +1V.

12. The display device according to claim 8, wherein the first gate is suspended or electrically connected to one of a high voltage power line, a low voltage power line, a reset signal line, or a ground line.

13. The display device according to claim 8, further comprising a first thin film transistor, a second thin film transistor, a third thin film transistor, a fourth thin film transistor, a fifth thin film transistor, a sixth thin film transistor, a seventh thin film transistor, a first scan line, a second scan line, a third scan line, a fourth scan line, a data line, and a first light-emitting control signal line;

wherein the reset signal line comprises a first reset signal line and a second reset signal line;

the first thin film transistor comprises a source and a drain, the source of the first thin film transistor is electrically connected to the high voltage power line, and the drain of the first thin film transistor is electrically connected to the low voltage power line;

the second thin film transistor comprises a source, a drain, and a gate, the source of the second thin film transistor is electrically connected to the source of the first thin film transistor, the drain of the second thin film transistor is electrically connected to the data line, and the gate of the second thin film transistor is electrically connected to the first scan line;

the third thin film transistor comprises a source and a drain, the source of the third thin film transistor is electrically connected to the drain of the first thin film transistor, the drain of the third thin film transistor is electrically connected to a gate of the first thin film transistor, the third thin film transistor comprises a first gate and a second gate, the first operating voltage connected to the first gate of the third thin film transistor is lower than the second operating voltage connected to the second gate, the first gate of the third thin film transistor is suspended or electrically connected to one of the high voltage power line, the low voltage power line, the first reset signal line, the second reset signal line, or the ground line, and the second gate of the third thin film transistor is electrically connected to the second scan line;

the fourth thin film transistor comprises a source and a drain, the source of the fourth thin film transistor is electrically connected to the gate of the first thin film transistor, the drain of the fourth thin film transistor is electrically connected to the first reset signal line, the fourth thin film transistor comprises a first gate and a second gate, wherein the first operating voltage connected to the first gate of the fourth thin film transistor is lower than the second operating voltage connected to the second gate of the fourth thin film transistor, the first gate of the fourth thin film transistor is suspended or is electrically connected to one of the high voltage power line, the low voltage power line, the first reset signal line, the second reset signal line, or the ground line, the second gate of the fourth thin film transistor is electrically connected to the third scan line;

the fifth thin film transistor comprises a gate, a source, and a drain, the gate of the fifth thin film transistor is electrically connected to the first light-emitting control signal line, the source of the fifth thin film transistor is electrically connected to the source of the first thin film transistor, and the drain of the fifth thin film transistor is electrically connected to the high voltage power line;

the sixth thin-film transistor comprises a gate, a source, and a drain, the gate of the sixth thin-film transistor is electrically connected to the first light-emitting control signal line, the source of the sixth thin-film transistor is electrically connected to the drain of the first thin-film transistor, and the drain of the sixth thin-film transistor is electrically connected to the low voltage power line; and the seventh thin film transistor comprises a source, a drain, and a gate, the source of the seventh thin film transistor is electrically connected to the drain of the sixth thin film transistor, the drain of the seventh thin film transistor is electrically connected to the second reset signal line, and the gate of the seventh thin film transistor is electrically connected to the fourth scan line.

14. The display device according to claim 13, wherein the third thin film transistor and the fourth thin film transistor both comprise the second active layer, a material of the second active layer comprises metal oxide; and the first thin film transistor comprises the first active layer, a material of the first active layer comprises low temperature polycrystalline silicon.

15. A display panel, comprising:

a substrate;

a first active layer disposed at one side of the substrate;

a second active layer disposed at one side of the first active layer away from the substrate, a material of the second active layer including metal oxide;

a first conductive layer disposed between the substrate and the second active layer, the first conductive layer comprising a first gate disposed corresponding to the second active layer; and a second conductive layer disposed at one side of the second active layer away from the substrate, the second conductive layer comprising a second gate disposed corresponding to the second active layer;

wherein a first operating voltage connected to the first gate is lower than a second operating voltage connected to the second gate, and a spacing between the first gate and the second active layer is larger than or equal to a spacing between the second gate and the second active layer;

wherein the first gate is suspended or electrically connected to one of a high voltage power line, a low voltage power line, a reset signal line, or a ground line.

16. The display panel according to claim 15, wherein the first gate and the first active layer are disposed in a same layer, and a material of the first gate is same as a semiconductor material of the first active layer.

17. The display panel according to claim 15, wherein the first conductive layer is disposed between the first active layer and the substrate, and the first conductive layer further comprises a light shielding portion disposed corresponding to the first active layer.

18. The display panel according to claim 15, wherein the first operating voltage connected to the first gate ranges from −7V to +1V.

* * * * *